United States Patent [19]

Matsunaga et al.

[11] Patent Number: 5,270,481
[45] Date of Patent: Dec. 14, 1993

[54] FILTER COEFFICIENT GENERATOR FOR ELECTRONIC MUSICAL INSTRUMENTS

[75] Inventors: Kaoru Matsunaga, Yaizu; Yutaka Washiyama, Hamamatsu, both of Japan

[73] Assignee: Kabushiki Kaisha Kawai Gakki Seisakusho, Hamamatsu, Japan

[21] Appl. No.: 912,454

[22] Filed: Jul. 13, 1992

[30] Foreign Application Priority Data

Jul. 29, 1991 [JP] Japan .................... 3-210347

[51] Int. Cl.⁵ .................. G10H 5/00; G10H 1/12; H03H 7/01
[52] U.S. Cl. .................. 84/661; 84/DIG. 9
[58] Field of Search .............. 84/661, 622, 626, 659, 84/662, DIG. 9

[56] References Cited

U.S. PATENT DOCUMENTS

| | | | |
|---|---|---|---|
| 4,433,604 | 2/1984 | Ott | 84/603 |
| 4,548,119 | 10/1985 | Wachi et al. | 84/622 |
| 4,829,463 | 5/1989 | Kakishita et al. | |
| 4,907,484 | 3/1990 | Suzuki et al. | 84/661 |
| 5,018,429 | 5/1991 | Yamaya et al. | 84/622 |

Primary Examiner—William M. Shoop, Jr.
Assistant Examiner—Jeffrey W. Donels
Attorney, Agent, or Firm—Joseph C. Mason, Jr.; Ronald E. Smith

[57] ABSTRACT

An electronic musical instrument comprises a filter coefficient generator, including a control signal generator for receiving timbre information, tone range information and touch information and for generating the first and second parameters to control a filter characteristic; a trigonometric function generator for generating a trigonometric function value based on the first parameter generated by the control signal generator; and a filter coefficient computing circuit for computing the trigonometric function value generated by the trigonometric function generator and the second parameter generated by the control signal generator. The filter coefficient generator sequentially generates filter coefficients by computation and sends them to a digital filter to continuously change the filter characteristic of the digital filter, thereby producing musical tones.

3 Claims, 8 Drawing Sheets

FILTER COEFFICIENT GENERATOR FOR ELECTRONIC MUSICAL INSTRUMENTS

BACKGROUND OF THE INVENTION

1. Field of the Invention

The present invention relates to an electronic musical instrument with a digital filter unit; more particularly, to an electronic musical instrument having a digital filter unit that computes a coefficient to be supplied to a digital filter.

2. Description of the Related Art

Recently, a digital filter unit is being used in electronic musical instruments, etc. to generate musical tones having various timbres.

The digital filter characteristic of the digital filter unit is determined by providing a predetermined filter coefficient from an external source.

Employing the above digital filter unit, an electronic musical instrument uses the above digital filter to control the timbre of tone signals. More specifically, tone signals with various timbres are generated by dynamically changing filter coefficients which are supplied to the digital filter unit.

Conventionally, to dynamically change filter coefficients to the digital filter unit, multiple predetermined filter coefficients are stored in a memory, and a controller reads desired filter coefficients from the memory, and supplies them to the digital filter unit.

To provide a digital filter unit that has various filter characteristics, however, filter coefficients to determine various filter characteristics must be stored in a memory in advance. This requires an excessively large memory storage capacity.

SUMMARY OF THE INVENTION

In order to eliminate the foregoing enumerated shortcomings, it is an object of the present invention to provide an electronic musical instrument that does not need a large memory capacity, and that can generate a variety of filter coefficients and sequentially supply them to a digital filter unit for generation of tone signals having a variety of timbres.

An electronic musical instrument of the present invention comprises a digital wave generator for generating a first digital wave for multiple channels and for outputting the first digital wave in a time shared manner, the first digital wave output from the digital wave generator being a digital wave according to timbre information, tone range information and touch information; a digital filter for receiving the first digital wave output from the digital wave generator, for performing a predetermined filter operation on the first digital wave in synchronism with the digital wave generator, and for outputting a second digital wave for multiple channels in a time shared manner; a filter coefficient generator for supplying a filter coefficient to the digital filter to sequentially change a filter characteristic, the filter coefficient generator including a control signal generator for receiving the timbre information, the tone range information and the touch information, and generating first and second parameters which control the filter characteristic, a trigonometric function generator for generating a trigonometric function value based on the first parameter generated by the control signal generator, and a filter coefficient computing circuit for computing the trigonometric function value generated by the trigonometric function generator and the second parameter generated by the control signal generator, whereby the filter coefficient computing circuit sequentially generates a filter coefficient to continuously change the filter characteristic of the digital filter; and an amplitude controller for controlling an amplitude of the second digital wave output from the digital filter, and for outputting a digital tone wave.

According to the present invention, after an equation for a digital filter coefficient is acquired by performing bilinear transformation on a transfer function for an analog filter, a predetermined modification is performed on that equation. Using the modified equation, which includes primarily a trigonometric function, digital filter coefficients are generated and continuously supplied to the digital filter to change a filter characteristic in a time shared manner, thereby controlling a timbre.

More specifically, the control signal generator in the filter coefficient generator, for example, generates first and second parameters which control a filter characteristic according to tone information received from an external source. The first parameter is to be produced in a form to be used as a variable of a trigonometric function representing a cutoff frequency.

When the first parameter is received by the trigonometric function generator, this generator produces a predetermined trigonometric function value for the first parameter. A filter coefficient is computed from this trigonometric function value and the second parameter. The resultant coefficient is supplied to the digital filter to complete a digital filter unit having a predetermined filter characteristic.

Through sequential computations and supply of filter coefficients to the digital filter, the first digital wave output from the digital wave generator is filtered by the digital filter whose characteristic changes in a time shared manner. The filtered wave is output as the second digital wave. As a result, digital tone waves having various timbres are obtained.

As described above, according to the present invention, a filter coefficient to be supplied to a digital filter is derived from arithmetic operations, thereby eliminating the memory storage space requirement for filter coefficients.

Further, since various filter coefficients can be generated by changing the first and second parameters, tone signals with various timbres can be accordingly generated.

DETAILED DESCRIPTION OF THE PREFERRED EMBODIMENTS

Figure 2:
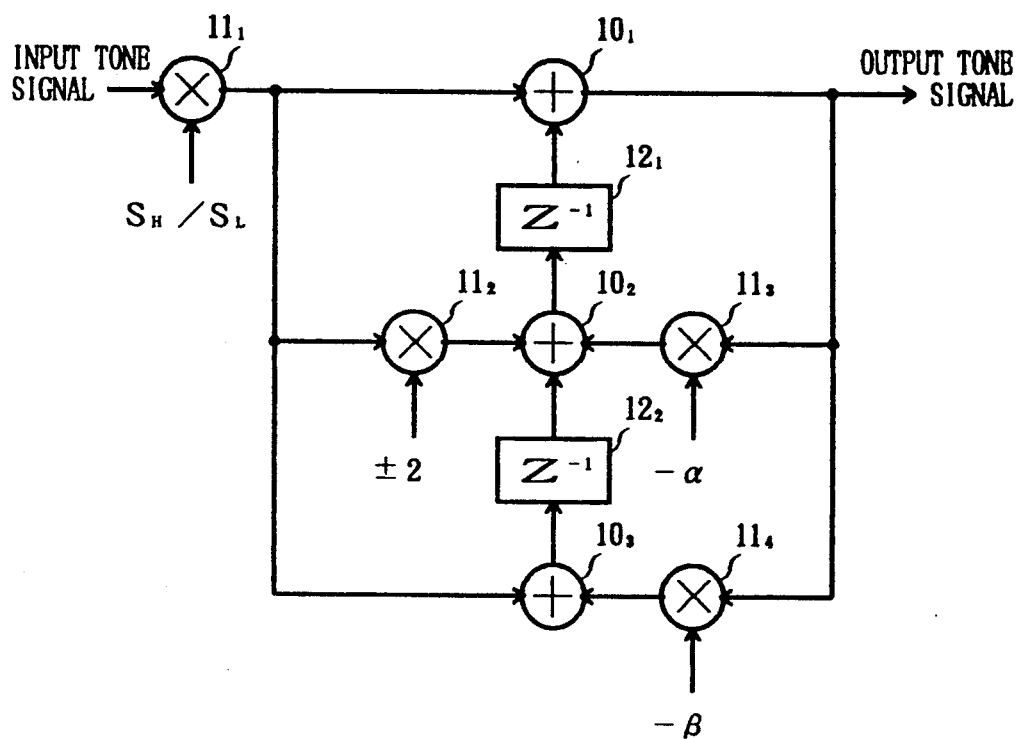
FIG. 2 is a diagram showing the essential arrangement of a digital filter circuit.

FIG. 2 illustrates an example of a fundamental structure of a digital filter circuit. Reference numerals $10_1$ to $10_3$ are adders, $11_1$ to $11_4$ are multipliers, and $12_1$ and $12_2$ are delay elements.

This digital filter circuit receives filter coefficients "$S_H/S_L$", "$\alpha$", "$\beta$" and "$\pm 2$".

The filter coefficients "$S_H$" and "$S_L$" are provided to form a high-pass filter and a low-pass filter, respectively. The filter coefficient "+2" is provided when a low-pass filter is to be formed and "−2" is provided when a high-pass filter is to be formed.

Generally, a method for performing bilinear transformation of a transfer function H(s) for an analog filter is used to form a digital filter.

In this method, filter coefficients to be sent to the digital filter circuit are derived by equations below.

$$\alpha = 2(\pi^2 R^2 - 1)/yy \quad (1)$$

$$\beta = (1 - \pi R/Q + \pi^2 R^2)/yy \quad (2)$$

$$S_H = 1/yy \quad (3)$$

$$S_L = \pi^2 R^2/yy \quad (4)$$

where $$R = \frac{\tan\theta}{\pi} \quad (5)$$

$$yy = \pi^2 R^2 + \pi R/Q + 1 \quad (6)$$

$$\theta = \pi \times \frac{fc}{FS} \quad (7)$$

Q represents a control parameter for a resonance characteristic that controls a gain from a resonance frequency, fc stands for a cutoff frequency, and FS is a sampling frequency.

The filter coefficients after bilinear transformation are expressed by complicated equations as shown above. If hardware is used to compute the filter coefficients, this hardware will also be very complicated.

Figure 3:
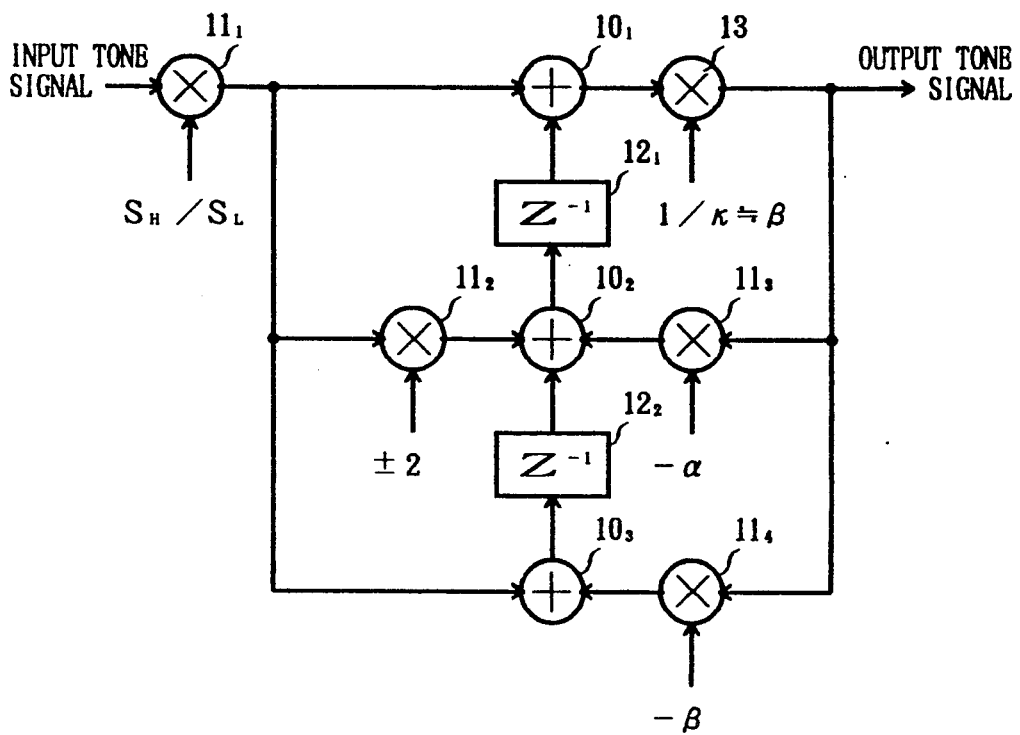
FIG. 3 is a diagram illustrating the structure of one embodiment of a digital control filter as applied to the present invention.

Therefore equations (1) to (4) are substantially modified to yield the following equations (8) to (13). (FIG. 3 shows the structure of a digital filter circuit corresponding to equations (8) to (13). The digital filter circuit in FIG. 3 further differs from that in FIG. 2 in that the circuit in FIG. 3 includes a multiplier 13.)

$$\alpha = -\cos(2\theta) \quad (8)$$

$$\beta = 2 - \kappa = 1 - \frac{\sin(2\theta)}{2Q} \quad (9)$$

$$S_H = \frac{1 + \cos(2\theta)}{2} \quad (10)$$

$$S_L = \frac{1 - \cos(2\theta)}{2} \quad (11)$$

$$\kappa = 1 + \frac{\sin(2\theta)}{2Q} \quad (12)$$

where $$\theta = \pi \times \frac{fc}{FS} \quad (13)$$

Through the above modification, the individual filter coefficients can be represented in a very simple form using trigonometric functions. This makes hardware computations easy.

One embodiment of a digital filter unit that uses equations (8) to (13) to compute filter coefficients to control a filter characteristic will now be described.

Figure 4:
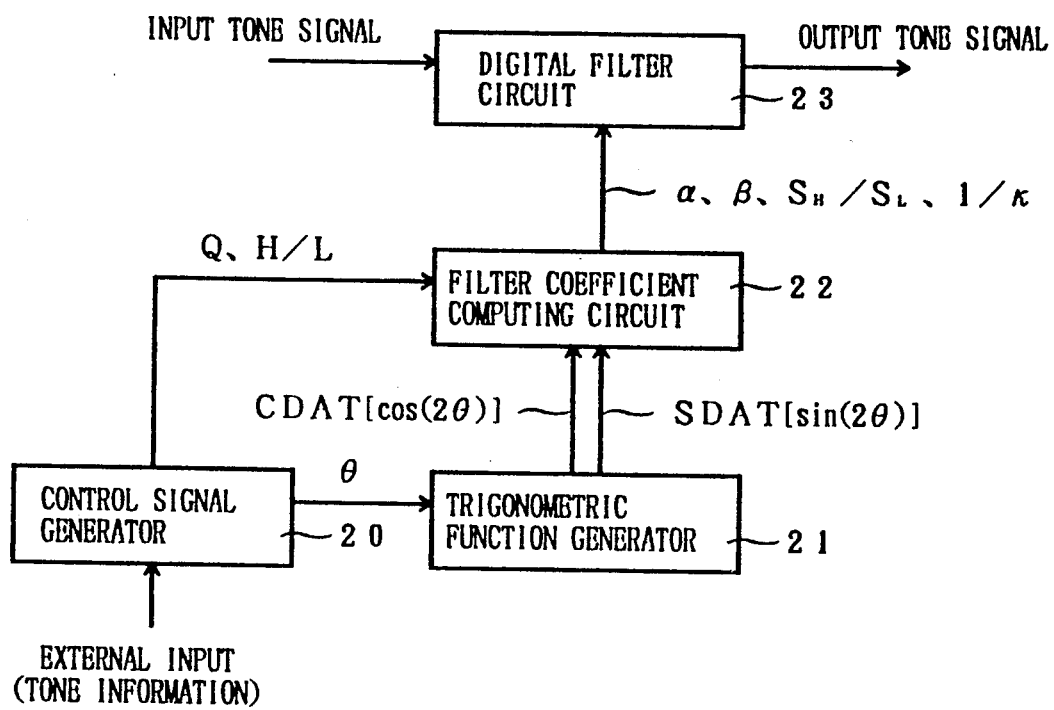
FIG. 4 is a block diagram showing the structure of one embodiment of a digital filter unit as applied to the present invention.

FIG. 4 is a block diagram showing the structure of the embodiment of a digital filter unit as applied to an electronic musical instrument according to the present invention.

A control signal generator 20 generates "$\theta$", "Q" and "H/L" in accordance with timbre information, tone range information or touch information received from an external source, for example, from a Central Processing Unit (CPU). "$\theta$", a value representing a cutoff frequency derived by equation (13), includes a significant digit in a decimal fraction part.

"$\theta$" generated by the control signal generator 20 is sent to a trigonometric function generator 21. "Q" and "H/L" are supplied to a filter coefficient computing circuit 22.

Based on the "$\theta$" received from the control signal generator 20, the trigonometric function generator 21 produces "cos(2$\theta$)" (hereafter referred to as "CDAT") and "sin(2$\theta$)" (hereafter referred to as "SDAT"). The details of the trigonometric function generator 21 will be explained later.

CDAT and SDAT, produced by the trigonometric function generator 21, are sent to a filter coefficient computing circuit 22.

The filter coefficient computing circuit 22 receives "Q" and "H/L" from the control signal generator 20, and CDAT and SDAT from the trigonometric function generator 21, and computes filter coefficients $\alpha$, $\beta$, $S_H$ or $S_L$, and $1/\kappa$ in accordance with equations (8) to (13).

The filter coefficients $\alpha$, $\beta$, $S_H$ or $S_L$, and $1/\kappa$ are supplied to a digital filter circuit 23.

The digital filter circuit 23 is arranged as shown in FIG. 3. The filter coefficients $\alpha$, $\beta$, $S_H$ or $S_L$, and $1/\kappa$, which are computed by the filter coefficient computing circuit 22, establish a filter having a predetermined characteristic in the digital filter circuit 23. The digital filter circuit 23 performs predetermined filtering of a received tone signal and outputs a filtered tone signal.

The computation of the filter coefficients is performed synchronously with the timing for generation of a digital tone wave by a digital control oscillator 64 which will be described later. That is, when the digital control oscillator 64 produces a digital tone wave upon reception of the above tone information, the filter coefficient computing circuit 22 computes $\alpha$, $\beta$, $S_H$ or $S_L$, and $1/\kappa$ synchronously and supplies them to the digital filter circuit 23. The filter characteristic of the digital filter circuit 23 therefore changes dynamically.

High-pass, low-pass and band-pass filter characteristics can be derived from the above filter coefficients $\alpha$, $\beta$, $S_H$ or $S_L$, and $1/\kappa$.

Figure 5:
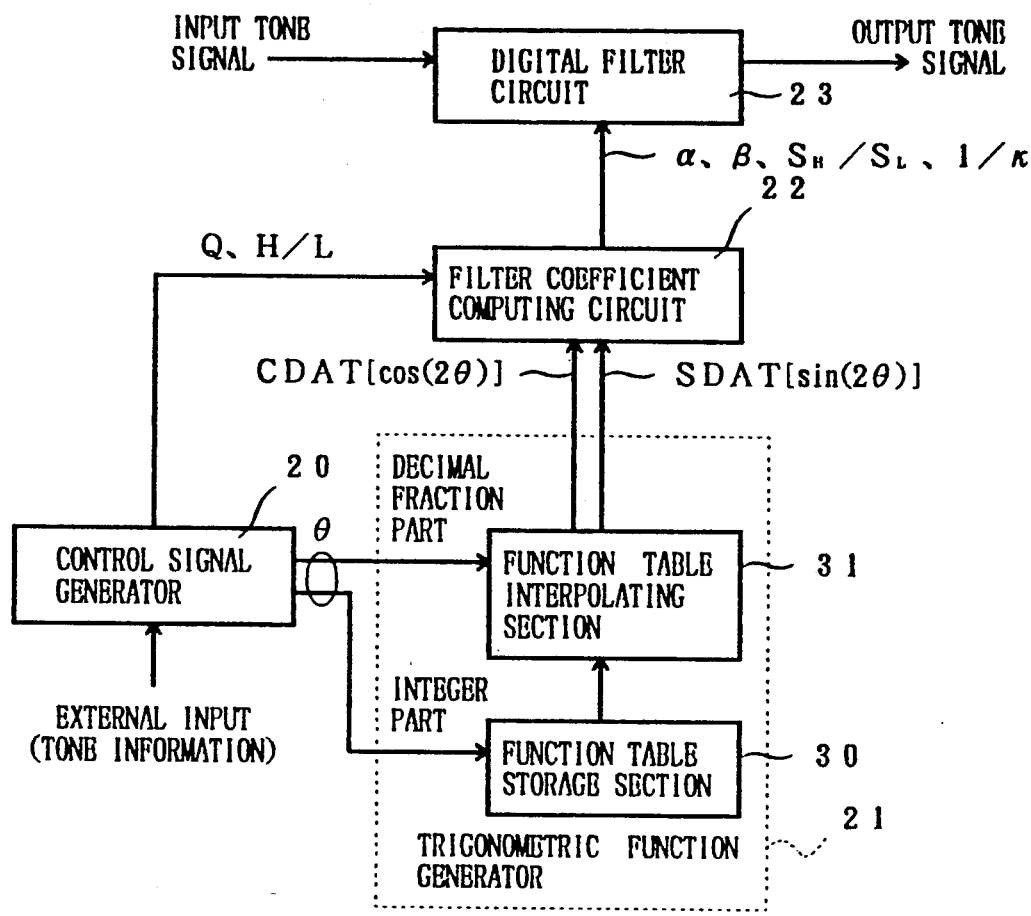
FIG. 5 is a block diagram showing the arrangement of a trigonometric function generator in FIG. 4.

FIG. 5 is a block diagram illustrating the structure of the trigonometric function generator 21 in the digital filter unit. The control signal generator 20 supplies a parameter $\theta$, which includes a decimal fraction part, to the trigonometric function generator 21.

The trigonometric function generator 21 includes a function table storage section 30 and a function table interpolating section 31. The integer part of the parameter $\theta$ generated by the control signal generator 20 is sent to the function table storage section 30. The decimal fraction part of the parameter $\theta$ is supplied to the function table interpolating section 31.

The function table storage section 30 stores values $\sin 2\theta$ and $\cos 2\theta$, where the parameter $\theta$ is a variable, as function tables. Upon receipt of the parameter $\theta$, the function table storage section 30 searches for a function table whose $\theta$ value matches the integer part of the received parameter $\theta$, and supplies a predetermined value to the function table interpolating section 31. In accordance with the value of the decimal fraction part of the parameter $\theta$, the function table interpolating section 31 then performs proportional distribution of the predetermine value from the function table storage section 30 to produce the exact values of CDAT and SDAT.

Figure 6:
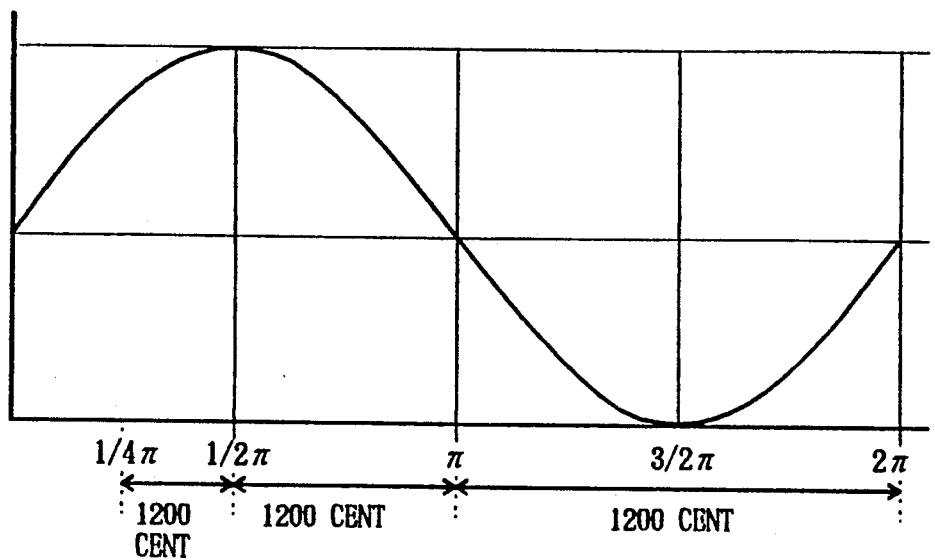
FIG. 6A is a graph showing the structure of a function table of the trigonometric function generator in FIG. 4 when the angle for trigonometric functions is stored using a sine wave.
FIG. 6B is a graph showing the structure of a function table of the trigonometric function generator in FIG. 4 when the angle for trigonometric functions is stored using linear scales.
Figure 6:
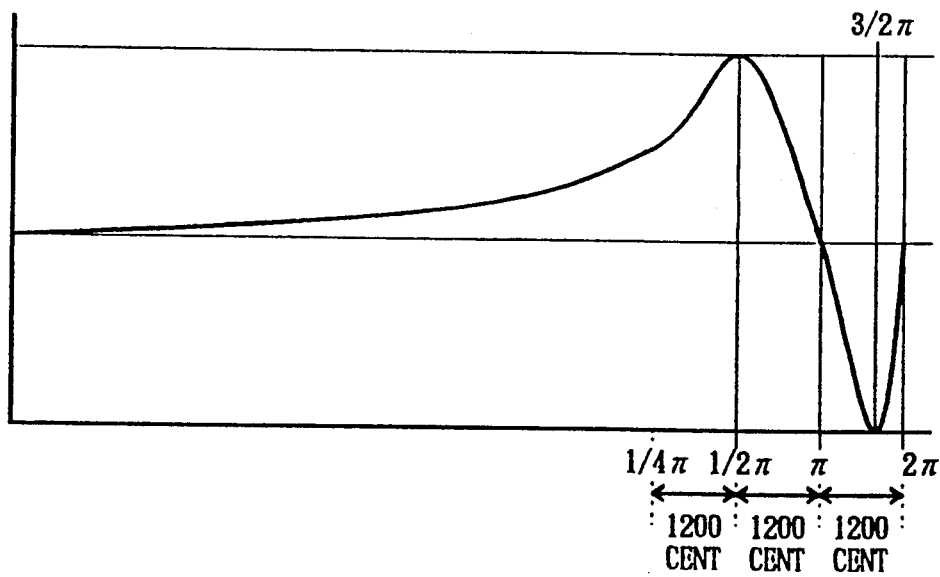

FIG. 6A shows an example of a sine wave stored in the function table of the function table storage section 30. FIG. 6B shows an example where the angle for trigonometric functions is stored using linear scales. As shown in the graph, the interval for one octave (1200 cent) varies depending on the angle for the trigonometric functions.

Therefore, using the function table, when control matching the aural sense of a human, for example, control by the cent, is to be performed, the larger the angle the wider the range that must be controlled.

In this embodiment, the trigonometric functions are stored with the angle of the trigonometric functions represented using logarithmic scales. FIG. 6B illustrates an example where the angles of trigonometric functions, represented by logarithmic scales, are stored. In this graph, the octave (1200 cent) intervals are constant, regardless of the sizes of the trigonometric function angles.

With the function table, control by the cent in equal ranges is possible regardless of angle size, thereby controlling a cutoff frequency so as to match the aural sense of a human.

Calculating a power series can be used as a method for producing trigonometric functions. Using this method, $\sin\theta$ and $\cos\theta$ are derived from the following equations.

$$\sin\theta = \theta - \frac{\theta^3}{3!} + \frac{\theta^5}{5!} - \frac{\theta^7}{7!} + \cdots \quad (14)$$

$$\cos\theta = 1 - \frac{\theta^2}{2!} + \frac{\theta^4}{4!} - \frac{\theta^6}{6!} + \cdots \quad (15)$$

where $$\theta = \pi \times \frac{fc}{FS} \quad (16)$$

The output of the trigonometric function generator 21, the CDAT and the SDAT, is passed to the filter coefficient computing circuit 22.

Figure 7:
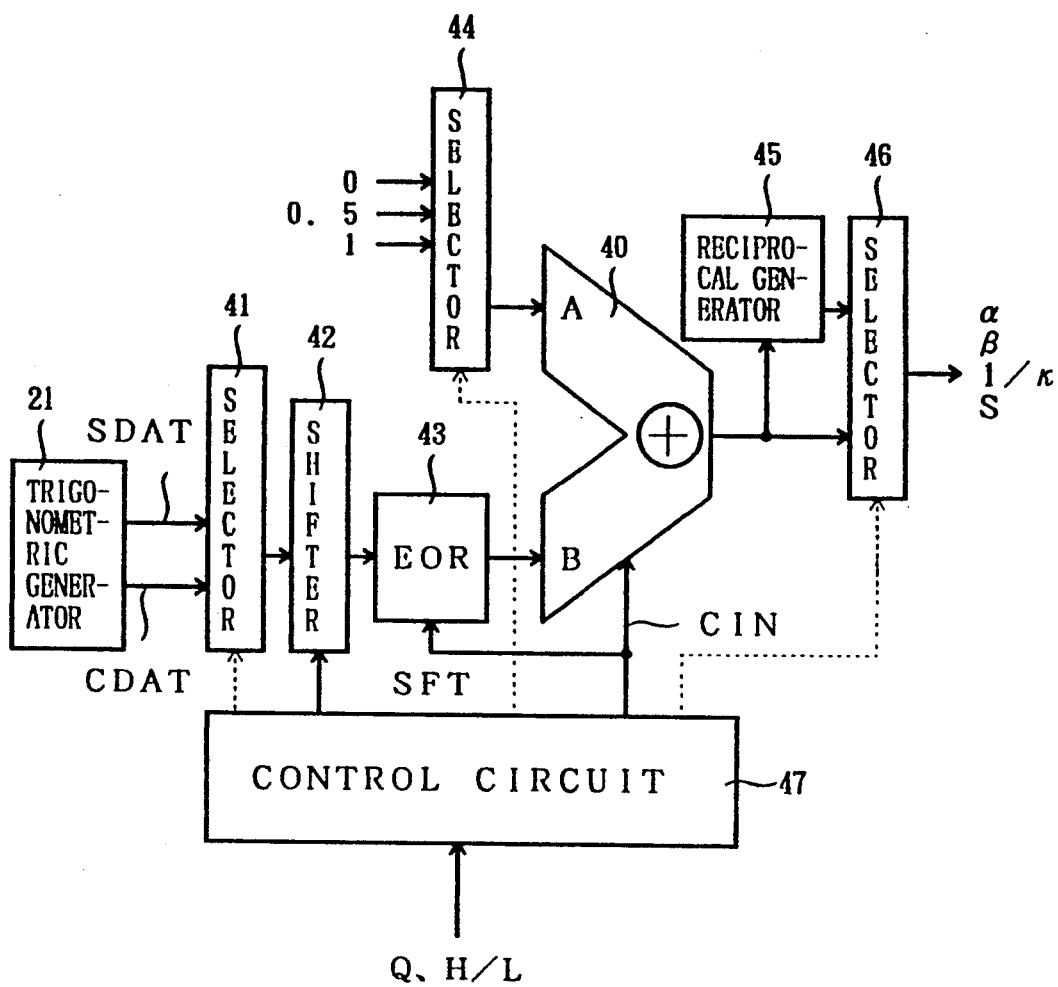
FIG. 7 is a circuit diagram illustrating the structure of a filter coefficient computing circuit in FIG. 4.

The circuit diagram in FIG. 7 shows the detailed structure of the filter coefficient computing circuit 22.

Within the filter coefficient computing circuit 22, input data is processed and passed to input terminal A and input terminal B of an adder 40. The adder 40 adds the data input to the input terminal A to the data input to the input terminal B, and outputs the result.

The CDAT and the SDAT, which are passed to the filter coefficient computing circuit 22 by the trigonometric function generator 21, are processed by a selector 41, a shifter 42, and an exclusive OR gate (hereafter referred to as "EOR gate") 43 in the named order, and the resultant datum is passed to the input terminal B of the adder 40.

During this process, the selector 41, in response to a signal from the control circuit 47, selects either the SDAT or the CDAT, and passes the selected datum to the shifter 42.

The shifter 42 right-shifts the datum received from the selector 41 (the SDAT or the CDAT) the number of bits corresponding to a count carried by a shift signal SFT from the control circuit 47, and passes the result to the EOR gate 43.

The EOR gate 43, in response to a carry signal CIN from the control circuit 47, either inverts or leaves unchanged the datum passed by the shifter 42 and passes this datum to the input terminal B of the adder 40. With the inverted datum passed by the EOR gate 43 and the carry passed to the adder 40, the adder 40 performs two's complement subtraction.

Concurrently, a selector 44, which is connected to the input terminal A of the adder 40, receives constants "0", "0.5", and "1", and in response to a control signal from the control circuit 47, selects one of the constants, and passes it to the input terminal A of the adder 40.

The output of the adder 40 is sent to a reciprocal generator 45 and a selector 46.

The reciprocal generator 45 calculates a reciprocal of the output of the adder 40. As will be described later, the reciprocal generator 45 is used to obtain "$1/\kappa$, the reciprocal of the coefficient "$\kappa$" that is output by the adder 40.

The selector 46 selects the output of either the adder 40 or the reciprocal generator 45 in accordance with a control signal from the control circuit 47, and sends it to the digital filter circuit 23.

The control circuit 47 receives "Q", "H/L", etc. from the control signal generator 20, and generates a control signal to control the entire filter coefficient computing circuit 22.

Figure 8:
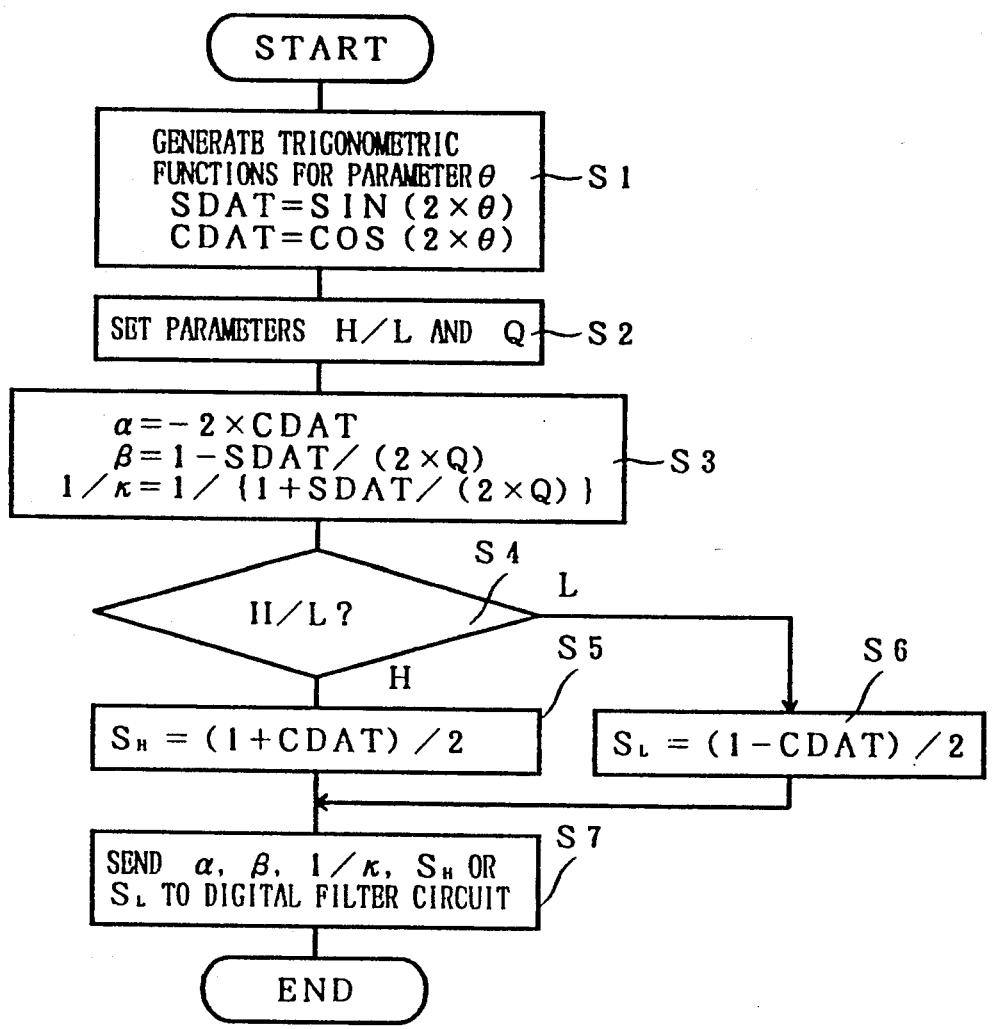
FIG. 8 is a flowchart showing the operation of the embodiment of the digital filter unit as applied to the present invention.

The operation of the digital filter unit will now be explained referring to a flowchart shown in FIG. 8. To simplify the explanation, "Q" is supposed to meet the condition $Q = 2^{n-1}$ ($n = 1, 2, 3, 4, \ldots$).

When the control signal generator 20 receives tone information, such as timbre information, tone range information, or touch information, from an external source, it generates a parameter $\theta$ corresponding to cutoff frequency information, and sends this parameter to the trigonometric function generator 21. Upon receipt of the parameter $\theta$, the trigonometric function generator 21 produces SDAT and CDAT (step S1).

In other words, the integer part of the parameter $\theta$ is sent to the function table storage section 30, where a predetermined value corresponding to $\theta$ is searched for and read out. The function table interpolating section 31 then interpolates the predetermined value in accordance with the decimal fraction part of the parameter $\theta$. As a result, $\sin(2\theta)$, i.e., SDAT, and $\cos(2\theta)$, i.e., CDAT, are produced.

Then, the control signal generator 20 sends parameters Q and H/L to the filter coefficient computing circuit 22 (step S2). The parameters Q and H/L are set in the control circuit 47 of the filter coefficient computing circuit 22. The control circuit 47 produces various control signals to compute filter coefficients and outputs the signals.

Then, filter coefficients $\alpha$, $\beta$ and $1/\kappa$ are computed (step S3).

The filter coefficient $\alpha$ is obtained as "$\alpha = -\text{CDAT}$", as expressed by equation (8) above. More specifically, the control circuit 47 directs the selector 41 to select the CDAT, and permits the shifter 42 to pass the CDAT with no shift. The control circuit 47 enables the carry signal CIN. The data CDAT is therefore inverted by the EOR gate 43 and is sent to the input terminal B of the adder 40.

Further, the control circuit 47 controls the selector 44, which in turn selects "0". The adder 40 thus receives "0" at its input terminal A.

The adder 40 performs the addition "0+inverted CDAT +1", i.e., "0−CDAT", and outputs the result "−CDAT". The control circuit 47 allows the selector 46 to pass the output from the adder 40, so that "−CDAT" is obtained as the filter coefficient $\alpha$.

The filter coefficient $\beta$ is yielded as "$\beta = 1 - \text{SDAT}/2Q$", as expressed by equation (9) above. More specifically, the control circuit 47 directs the selector 41 to select and pass the SDAT. Further, the control circuit 47 sends "Q", the shift signal SFT, to the shifter 42 to right-shift the SDAT by Q bits, thereby dividing the SDAT by "2Q". The control circuit 47 enables the carry signal CIN. The data SDAT is then inverted by the EOR gate 43 and is sent to the input terminal B of the adder 40.

Further, the control circuit 47 controls the selector 44, which in turn selects "1". The adder 40 thus receives "1" at its input terminal A.

The adder 40 performs the addition "1+inverted SDAT/2Q+1", i.e., "1−SDAT/2Q", and outputs the result. The control circuit 47 directs the selector 46 to pass the output from the adder 40, so that "1−SDAT/2Q" is obtained as the filter coefficient $\beta$.

As for the filter coefficient $1/\kappa$, $\kappa$ should be calculated first. $\kappa$ is obtained as "$\kappa = 1 + \text{SDAT}/2Q$", as expressed by equation (12) above. More specifically, the control circuit 47 directs the selector 41 to select and pass the SDAT. Further, the control circuit 47 sends "Q", the shift signal SFT, to the shifter 42 to right-shift the SDAT by Q bits, thereby dividing the SDAT by "2Q". The control circuit 47 disables the carry signal CIN. The data SDAT then passes through the EOR gate 43 without change and is sent to the input terminal B of the adder 40.

Further, the control circuit 47 controls the selector 44, which in turn selects "1". The adder 40 thus receives "1" at its input terminal A.

The adder 40 performs the addition "1+SDAT/2Q" and outputs the result. The control circuit 47 directs the selector 46 to pass the output from the reciprocal generator 45, so that "$1/(1+\text{SDAT}/2Q)$" is obtained as the filter coefficient $1/\kappa$.

After the filter coefficients are obtained, it is then determined whether the parameter "H/L" output from the control signal generator 20 designates "H", i.e., a high-pass filter, or "L", i.e., a low-pass filter (step S4).

When the parameter is judged to be "H", the filter coefficient $S_H$ is computed (step S5). In other words, the filter coefficient $S_H$ is obtained as "$S_H = (1+\text{CDAT})/2$", as described by equation (10). More specifically, the control circuit 47 directs the selector 41 to select and pass the CDAT. Further, the control circuit 47 sends "1", the shift signal SFT, to the shifter 42 to right-shift the CDAT by one bit, thereby dividing the CDAT by "2".

The control circuit 47 disables the carry signal CIN. The data CDAT then passes through the EOR gate 43 without change and is sent to the input terminal B of the adder 40.

Further, the control circuit 47 controls the selector 44, which in turns selects "0.5". The adder 40 thus receives "0.5" at its input terminal A.

The adder 40 performs the addition "0.5+CDAT/2" and outputs the result. The control circuit 47 directs the selector 46 to pass the output from the adder 47, so that "$(1+\text{CDAT})/2$" is obtained as the filter coefficient $S_H$.

When the parameter is judged to be "L" in step S4, the filter coefficient $S_L$ is computed (step S6). The filter coefficient $S_L$ is obtained as "$S_L = (1-\text{CDAT})/2$", as described by equation (11). More specifically, the control circuit 47 directs the selector 41 to select and pass the CDAT. Further, the control circuit 47 sends "1", the shift signal SFT, to the shifter 42 to right-shift the CDAT by one bit, thereby dividing the CDAT by "2". The control circuit 47 enables the carry signal CIN. The data CDAT is then inverted by the EOR gate 43 and is sent to the input terminal B of the adder 40.

Further, the control circuit 47 controls the selector 44, which in turn selects "0.5". The adder 40 thus receives "0.5" at its input terminal A.

The adder 40 performs the addition "0.5+inverted CDAT/2+1", i.e., "0.5−CDAT/2" and outputs the result. The control circuit 47 directs the selector 46 to pass the output of the adder 40, so that "$(1-\text{CDAT})/2$" is obtained as the filter coefficient $S_L$.

The filter coefficients $\alpha$, $\beta$, $1/\kappa$, and $S_H$ or $S_L$ are sent from the filter coefficient computing circuit 22 to the digital filter circuit 23 (step S7).

Upon receipt of the filter coefficients, the digital filter circuit 23 functions as a digital filter unit having a predetermined filter characteristic, and generates a tone signal having a given timbre.

The reciprocal generator 45 is used in this embodiment to acquire $1/\kappa$, but $\beta$ can be used as an approximation of $1/\kappa$ for a very low cutoff frequency.

More specifically, the equation (12) is altered to $$\kappa = 1 - X$$

where $$X = \frac{-\sin(2\theta)}{2Q}$$

Further, $$1 - X^n = (1-X)(1+X+X^2+\ldots X^{n-1}).$$

In the range where X is very small, $1/\kappa$ can be approximated as $$\frac{1}{1-X} \approx 1 + X + X^2 + \ldots$$

If this approximation is represented only by a linear term of $X$ as follows, $1/\kappa$ will approximate $\beta$.

$$\frac{1}{1-X} \approx 1 + X = \beta$$

When $\beta$ is used as the approximation of $1/\kappa$, the filter coefficient computing circuit 22 can be simplified by omitting the reciprocal circuit 45. Further, in this embodiment, $1/Q$ is acquired by right-shifting. If $1/Q$ is obtained by an arithmetic operation (division), sequential control of Q will be possible.

Figure 1:
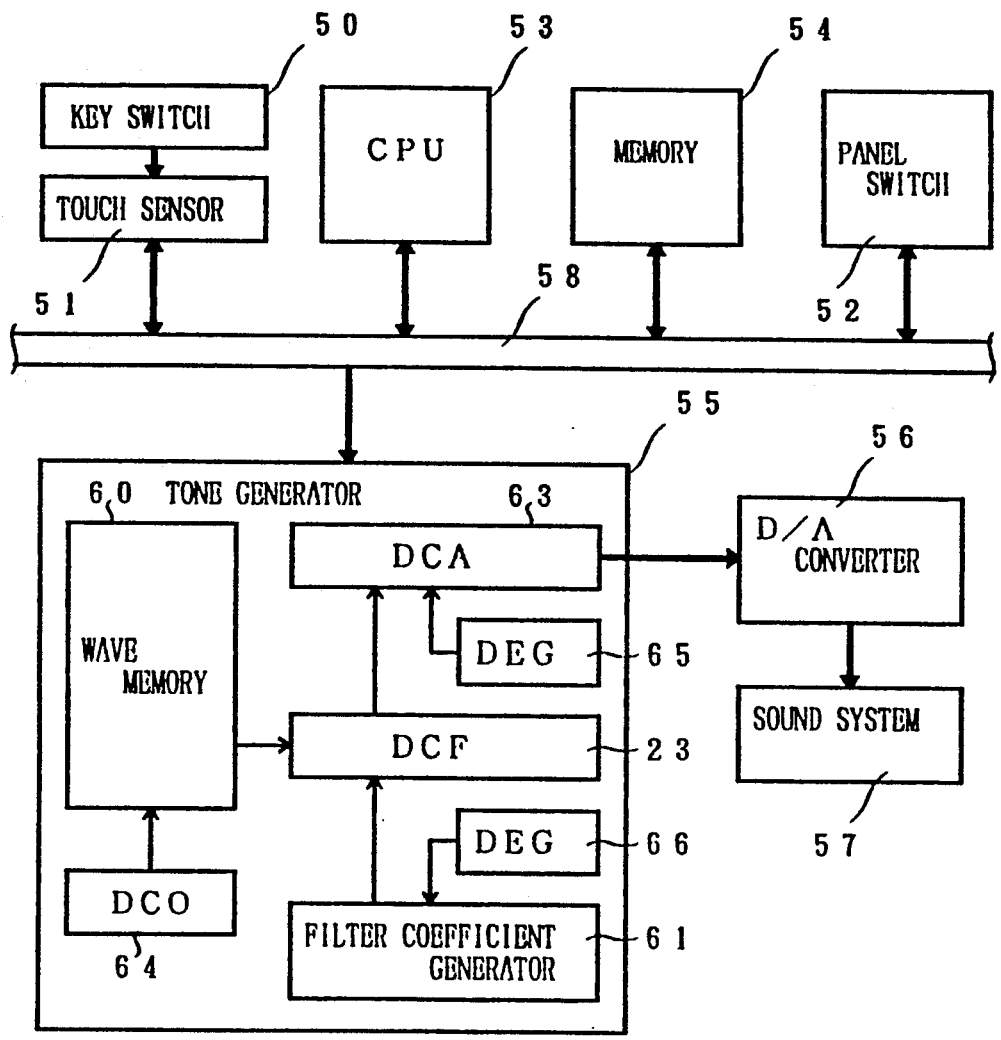
FIG. 1 is a schematic block diagram illustrating the general structure of an electronic musical instrument according to the present invention.

One embodiment of an electronic musical instrument where the above described digital filter unit is applied will now be explained. FIG. 1 is a schematic block diagram illustrating the general structure of an electronic musical instrument according to the present invention.

A key switch 50 interlocks with key depression/release by a player to open and close. The output of the key switch 50 is supplied to a touch sensor 51.

The touch sensor 51 is a well known sensor that detects force (speed) of key depression. The output of the touch sensor 51 is supplied as touch data through a Central Processing Unit (CPU) 53 to a tone generator 55.

Panel switches 52 are various switches, such as a rhythm select switch, a timbre select switch, and a volume switch, for controlling the electronic musical instrument.

The CPU 53 controls individual sections of the electronic musical instrument in accordance with a control program that is stored in a memory 54.

The memory 54 includes, for example, a Read Only Memory (ROM) and a Random Access Memory (RAM). Play data, timbre data, and various other fixed data, besides the control program, are stored in the ROM. In the RAM, a register, a flag, etc. to be used by the CPU 53 are defined, and the RAM is used as a work area for the CPU 53.

The tone generator 55 has a wave memory 60, a filter coefficient generator 61, a digital control filter (DCF) 23, a digital control amplifier (DCA) 63, the digital control oscillator (DCO) 64, and digital envelope generators (DEG) 65 and 66.

Tone wave data corresponding to individual timbres are stored in the wave memory 60. The digital control filter 23 filters the tone wave data stored in the wave memory 60, and outputs the filtered data.

The filter coefficient generator 61 is controlled by the CPU 53 and the digital envelope generator 66. The filter coefficient generator 61 is equivalent to the control signal generator 20, the trigonometric function generator 21, and the filter coefficient computing circuit 22 in the above-described digital filter unit.

The digital envelope generator 66 generates an envelope signal corresponding to timbre, tone range and touch, and supplies the envelope signal to the filter coefficient generator 61 in order to control a cutoff frequency.

The arrangement and the operation of the filter coefficient generator 61 have been described above when referring to FIG. 4. The filter coefficient generator 61 supplies the filter coefficients $\alpha$, $\beta$, $1/\kappa$, and $S_H$ or $S_L$ to the digital control filter 23.

The digital control filter 23 (equivalent to the previously described digital filter circuit 23 in FIG. 4) is designed as shown in FIG. 3, for example.

Upon receipt of the filter coefficients from the filter coefficient generator 61, the digital control filter 23 filters tone wave data which have been read from the wave memory 60, and sends this data to the digital control amplifier 63. The arrangement and operation of the digital control filter 23 have also previously been explained.

The digital control amplifier 63 multiplies the wave data from the digital control filter 23 and the output of the digital envelope generator 65, thereby controlling an amplitude.

Under the control of the CPU 53, the digital envelope generator 65 generates an envelope signal for controlling the amplitude of a digital tone wave that is output from the digital control filter 23.

A digital tone signal, output from the digital control amplifier 63, is supplied as the output of the tone generator 55 to a D/A converter 56.

The D/A converter 56 converts the received digital tone signal into an analog tone signal, which is in turn sent to a sound system 57.

The sound system 57 is constituted by, for example, loudspeakers. The sound system 57 in this embodiment is a well known transducer that converts an electric signal into an acoustic signal.

The touch sensor 51, the panel switches 52, the CPU 53, the memory 54, and the tone generator 55 are mutually connected by a system bus 58.

With this arrangement, the operation of the electronic musical instrument will now be described.

When the key switch 50 is turned on by key depression, a signal is sent from the key switch 50 to the touch sensor 51, which prepares touch data. The touch data is sent to the CPU 53 together with a key number of the depressed key switch 50.

The CPU 53 supplies the key number, touch data, etc. to the tone generator 55 together with timbre information and volume information which are selected by the panel switches 52.

The tone generator 55 reads tone wave data corresponding to the selected timbre from the wave memory 60 in accordance with an address output from the digital control oscillator 64, and sends the tone wave data to the digital control filter 23.

The filter coefficient generator 61 generates filter coefficients corresponding to the selected timbre and the output of the digital envelope generator 66, and supplies the filter coefficients to the digital control filter 23. The digital control filter 23 filters the tone wave data by a predetermined filter characteristic, and sends the filtered data to the digital control amplifier 63. The digital control amplifier 63 amplifies the received data, according to the output of the digital envelope generator 65, and then sends the data to the D/A converter 56.

The D/A converter 56 converts the received signal into an analog signal that is released from the sound system 57.

In this embodiment, the number of tone-ON channels of the tone generator 55 is not described; the present invention can be applied to a tone generator with a single channel or multiple channels. For a tone generator with multiple channels, the same hardware may be provided for the individual channels; however, in view of the reduction of hardware, it is preferable to operate multiple channels in a time shared manner.

If the tone generator has multiple channels, the filter characteristic of the digital filter will be controlled for the individual channels.

As described above, according to the present invention, it is possible to provide an electronic musical instrument which does not require a large memory to store filter coefficients, but can produce and continuously supply various filter coefficients to a digital filter unit, thus producing tone signals of various timbres.

This invention is clearly new and useful. Moreover, it was not obvious to those of ordinary skill in this art at the time it was made, in view of the prior art considered as a whole as required by law.

It will thus be seen that the objects set forth above, and those made apparent from the foregoing description, are efficiently attained and since certain changes may be made in the above construction without departing from the scope of the invention, it is intended that all matters contained in the foregoing construction or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,
What is claimed is:

1. An electronic musical instrument, comprising:
   digital wave generating means for generating a first digital wave for multiple channels and for outputting said first digital wave in a time shared manner, said first digital wave output from said digital wave generating means being a digital wave according to timbre information, tone range information, and touch information;
   digital filter means for receiving said first digital wave output from said digital wave generating means and for performing a predetermined filter operation on said first digital wave in synchronism with said digital wave generating means, and for outputting a second digital wave for multiple channels in a time shared manner;
   filter coefficient generating means for supplying filter coefficients to said digital filter means to sequentially channel predetermined filter characteristics;
   said predetermined filter characteristics including high-pass, low-pass, and band pass characteristics constituted to independently control a cutoff frequency for individual channels;
   said predetermined filter characteristics further including a resonance characteristic;
   said resonance characteristic having a resonance frequency and a gain that are separately or collectively independently controlled for individual channels;
   said filter coefficient generating means including control signal generating means for receiving said timbre information, said tone range information, and said touch information, and for generating first and second parameters which control said filter characteristic;
   said filter coefficient generating means further including trigonometric function generating means for generating a trigonometric function value based on said first parameter generated by said control signal generating means;
   said trigonometric function generating means including a function table for storing predetermined values corresponding to said first parameter, said function table searching for and reading out a predetermined value corresponding to said first parameter;
   said filter coefficient generating means further including filter coefficient computing means for computing said trigonometric function value generated by said trigonometric function generating means and said second parameter generated by said control signal generating means, whereby said filter coefficient computing means sequentially generates filter coefficients and continuously changes said filter characteristics of said digital filter means;
   amplitude control means for controlling an amplitude of said second digital wave output from said digital filter means, and for outputting a digital tone wave;
   an address of said function table corresponding to a cutoff frequency; and
   means for storing trigonometric function values for said cutoff frequency represented by logarithmic scales stored at individual addresses;
   whereby the amount of memory required to store a plurality of filter coefficients is reduced.

2. An electronic musical instrument according to claim 1, wherein said function table further includes interpolating means for interpolating data read from said function table, whereby trigonometric function values interpolated by said interpolating means are supplied to said filter coefficient computing means.

3. An electronic musical instrument according to claim 2, wherein said trigonometric function generating means generates trigonometric function values by calculating a power series.

* * * * *

UNITED STATES PATENT AND TRADEMARK OFFICE
CERTIFICATE OF CORRECTION

PATENT NO. : 5,270,481
DATED : December 12, 1993
INVENTOR(S) : Kaoru Matsunaga, Yutaka Washiyama It is certified that error appears in the above-indentified patent and that said Letters Patent is hereby corrected as shown below:

Claim 1, column 11, line 49, change "channel" to --change--.

This Certificate supersedes Certificate of Correction issued January 3, 1995.

Signed and Sealed this

Sixteenth Day of April, 1996

*Attest:*

BRUCE LEHMAN

*Attesting Officer*   Commissioner of Patents and Trademarks